Feb. 5, 1963 J. H. REAVES ET AL 3,076,900

FLIP-FLOP CIRCUITS

Filed Jan. 20, 1959 2 Sheets-Sheet 1

INVENTORS
JOHN F. WALTON
JOHN H. REAVES
BY Hurvitz + Rose
ATTORNEYS

INVENTORS
JOHN F. WALTON
JOHN H. REAVES
BY Hurwitz + Rose
ATTORNEYS

United States Patent Office 3,076,900
Patented Feb. 5, 1963

3,076,900
FLIP-FLOP CIRCUITS
John H. Reaves, McLean, and John F. Walton, Falls Church, Va., assignors to Elcor Inc., Falls Church, Va., a corporation of Virginia
Filed Jan. 26, 1959, Ser. No. 787,889
14 Claims. (Cl. 307—88.5)

The present invention relates to flip-flop circuits and more particularly to a highly stable, flip-flop circuit capable of responding to input pulses convering a range of frequencies from variable direct current to many megacycles per second. A basic prior art flip-flop circuit comprises two amplifying element such as triodes having their anodes returned through distinct load resistors to a common source of anode potential and having their respective grids connected through voltage-dropping resistive coupling networks to the anode of the other amplifying element. Input pulses may be applied to control electrodes of both of the amplifying elements and a positive pulse applied to one control electrode renders its associated amplifying element conductive thereby rendering the other amplifying element non-conductive.

In the bi-stable multivibrator, direct coupling is required between the two stages in order to obtain two stable states of operation. In order to insure complete reliability of switching of the flip-flop from one state to the other, instability in the coupling networks must be minimal. Otherwise the apparatus may become unreliable in the presence of large variations in circuit parameters such as supply voltage, etc. As is well known, direct coupled circuits are subject to drift over extended periods of operation and consequently, the reliability of flip-flop circuits employing conventional direct coupling techniques may become marginal in time.

An additional difficulty experienced with the flip-flop circuits as described above arises when many flip-flop stages are cascaded since in conventional circuit design all of the flip-flop stages utilize a single anode power supply. Switching of one of the flip-flop stages due to intercoupling between the stages through the common power supply, produces cross coupling between the circuits and may result in false operation of one or more of the circuits.

It is therefore a primary object of the present invention to provide a flip-flop circuit which may operate over a frequency spectrum from varying direct current to many megacycles per second.

It is another object of the present invention to provide a basic flip-flop circuit which may be cascaded with other flip-flop circuits without producing interaction between the circuits through a common power supply.

It is another object of the present invention to provide a flip-flop circuit in which the output voltage pulses have a base voltage at or near ground potential.

In accordance with the present invention a flip-flop circuit is provided in which each tube utilizes a distinct low capacity, isolated power supply as disclosed in co-pending patent application Serial No. 683,740 filed by John F. Walton and John H. Reaves on September 13, 1957, and entitled, Isolated Power Supply. In a basic circuit, two triodes are employed and the control electrode of each triode is connected through a different one of the aforesaid power supplies to the anode of the other triode and is also connected to ground through a distinct load resistor. In an exemplary embodiment of the invention, the triodes may have their cathodes connected directly to ground.

As a result of this arrangement, the only voltage appearing at the grids of the tubes is the voltage developed across the load resistor. When a first tube is in a non-conductive state no current flows through its associated resistor, and the grid of the second tube is at ground potential; that is, at the same potential as its cathode, and therefore the second tube is conductive. Current flow through the second tube reduces the voltage at the grid of the other tube to a negative potential with respect to ground and therefore the other tube is biased to cut off. Since the voltages across the load resistors have a base voltage at ground potential, coupling capacitors are not required for D.C. blocking and the frequency response of the system is limited basically by the shunt capacity to ground of the power supplies which is in the neighborhood of 20 micro-micro-farads. Therefore, the shunt capacity of the supplies do not begin to affect the operation of the circuit until the switching rate of the system approaches the megacycle region. Since direct coupling may be effected without the utilization of voltage divider circuits and the cathodes of the tubes may be directly grounded, the circuit is extremely stable even though it is operable over an extended frequency range. Further, since each tube utilizes an independent power supply, interstage coupling is eliminated and cascaded circuits achieve a degree of stability not attainable where a single power supply is employed for all tubes.

As indicated above, the output wave forms have a base voltage at ground potential but this may readily be varied in accordance with the invention by placing voltage dividers across the power supply and taking the output voltage from any point along the voltage dividers. These voltage dividers do not introduce instability into the circuit since the voltage across the divider is a function only of the voltage of the supply and is not affected by variations in any of the circuit parameters.

The high frequency response of the circuit may be extended by utilizing high frequency compensation techniques which compensate for the signal degradation introduced by the capacity of the supplies. The shunt capacity to ground of the power supplies appears in parallel with the load resistors of the flip-flop circuit and as the frequency of switching increases the capacitive reactance of the shunt capacity to ground decreases and introduces an increasing shunting effect across the load resistors.

In accordance with one embodiment of the invention a parallel combination of a resistor and inductor are inserted between the anodes of each of the tubes and the isolated power supplies and the signals developed at the anodes of each of the tubes are coupled through a capacitor to a resistive network where these signals are added to the signals developed across the aforesaid load resistors. The parallel combination of inductance and resistance constitutes a high pass filter whereas the load resistor and the capacity of the power supply constitute a low pass filter. By properly designing the filters, the circuits may completely complement one another so that the response of the circuit is uniform over a frequency range from varying direct current to an order of magnitude of 50 megacycles per second. The basic compensation technique utilized and other compensation techniques which may be employed in the circuit are disclosed and claimed in the co-pending patent application of John H. Reaves and John F. Walton filed November 28, 1958, Serial No. 777,037 and entitled, Wide Band Direct Coupled Amplifier.

The circuit of the invention may be extended to include transistors and pentodes. In one embodiment where a pentode is employed with the frequency compensation circuit, the screen voltage of the pentode may be derived directly from the individual power supply so that additional power supplies or complex isolation networks need not be employed.

It is another object of the present invention to provide a flip-flop circuit utilizing individual power supplies for each of the amplifying elements utilized in the basic flip-flop circuit.

It is yet another object of the present invention to provide a flip-flop circuit utilizing individual power supplies for each of the amplifying elements and incorporation high frequency compensation techniques which permit operation of the circuit over a range of frequencies from varying direct current to an order of magnitude of 50 megacycles per second.

The above and still further objects, features and advantages of the present invention will become apparent upon consideration of the following detailed description of one specific embodiment thereof, especially when taken in conjunction with the accompanying drawings, wherein.

Figure 1:
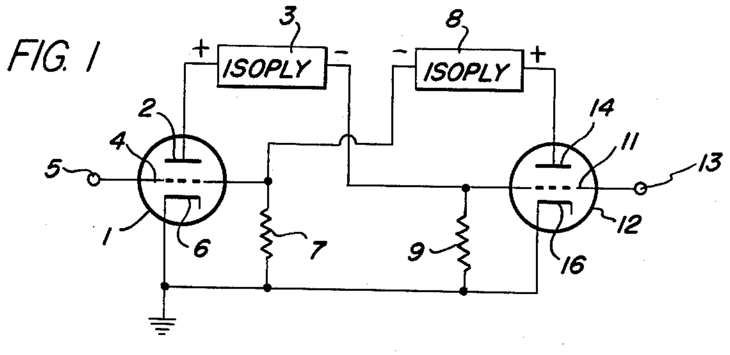
FIGURE 1 is a schematic wiring diagram of a basic flip-flop circuit employing a distinct power supply for each amplifying element.

Referring specifically to FIGURE 1 of the accompanying drawings, there is illustrated a schematic wiring diagram of a basic flip-flop circuit utilizing individual low capacitance, isolated, power supplies for each of the tubes of the circuit. A tube 1 has an anode 2 connected to a positive terminal of an isolated power supply 3, a control grid 4 connected to an input terminal 5, and a cathode 6 connected to a source of reference potential which, for the purposes of illustration only, is designated as ground. The control grid 4 of the tube 1 is further connected through a resistor 7 to ground and to the negative terminal of an isolated low capacitance, power supply 8. The negative terminal of the supply 3 is connected to ground through a load resistor 9 and to a control grid 11 of a second triode 12. The control grid 11 is also connected to a second input terminal 13. The tube 12 is further provided with an anode 14 connected to the positive terminal of the supply 8 and a cathode 16 connected to ground. The input terminals 5 and 13 may also serve as the output terminals of the circuit. In describing the operation of the circuit it is initially assumed that the tube 1 is conducting and the tube 12 is non-conducting. Conduction of the tube 1 maintains the voltage at the grid 11 of tube 12 at a value which is negative with respect to ground and therefore maintains the tube 12 biased to cut off. As a result of non-conduction of the tube 12, the voltage on the grid 4 of the tube 1 is at ground potential, this being the same as the potential applied to the cathode 6 and therefore the tube 1 is conductive. Upon application of a positive pulse to the input terminal 13, the tube 12 begins to conduct and produces current flow through the resistor 7. This reduces the voltage at the end of the resistor 7 connected to the grid 4 and the grid 4 goes slightly negative with respect to ground reducing conduction through the tube 1. Reduction of current flow through the tube 1 raises the voltage at the end of the resistor 9 connected to the grid 11 and increases the initial effect of the input pulse applied to the terminal 5. Thus, the effects of the circuit are cumulative and the tube 1 is rapidly cut off and the tube 12 rapidly becomes fully conductive. The two tubes maintain the second stable state until a positive pulse is applied to the terminal 5 and such a pulse causes the two tubes to again switch their states of conduction.

As a result of the utilization of the individual low capacitance isolated power supplies 3 and 8, the voltages across the resistors 7 and 9 do not deviate very much from ground potential. When a tube is non-conductive the upper end, as viewed in FIGURE 1, of its associated load resistor is at ground potential while the upper end of the resistor associated with the fully conductive tube is negative with respect to ground but the negative deviation from ground is not great when compared to the quiescent or average value of the voltage at the signal ends of the anode load resistor in conventional flip-flop circuits employing grounded power supplies. In consequence, the voltages across the resistors 7 and 9 may be coupled directly to succeeding stages of flip-flops or other utilization devices without the requirement of capacitive coupling in order to block high D.C. potential from the control electrodes of the amplifying devices utilized in subsequent stages. Further, the utilization of individual power supplies in each of the flip-flop circuits prevents unwanted intercoupling between cascaded flip-flop circuits since the only connection therebetween is an output connection from one stage to an input connection of the next succeeding stage. In conventional flip-flop circuits, the common power supply serves to produce intercoupling between the stages and often special circuits must be devised to minimize the effects of interstage coupling.

Figure 2:
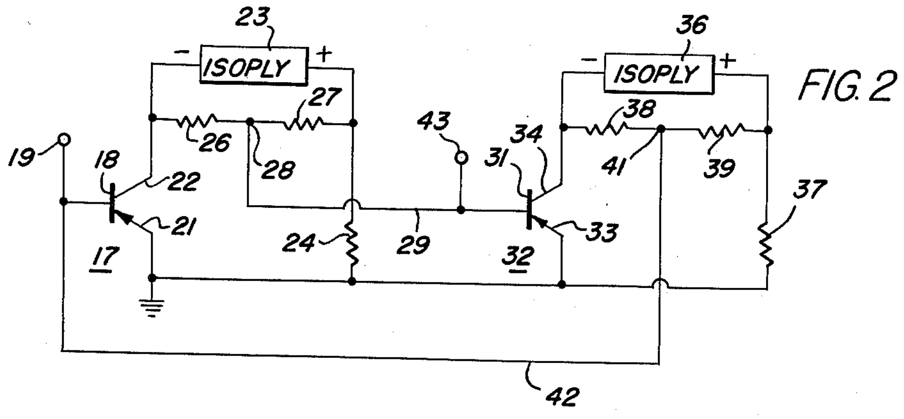
FIGURE 2 is a schematic wiring diagram of an embodiment of the invention employing transistors and a D.C. level control.

The direct connection of the output terminals of the circuit to the upper ends of the resistors 7 and 9 respectively does provide a limitation on the circuit in that the output potentials are fixed at those developed across the resistors 7 and 9 and the voltages across these resistors may be inappropriate for direct application to specific circuits. Reference is now made to FIGURE 2 of the accompanying drawings which disclose a circuit for eliminating the dependency of the output voltage upon the value of the load resistors and which further discloses the interchangeability of transistor circuits for the tube circuits of FIGURE 1.

A transistor 17 has a base electrode 18 connected to a first input terminal 19 and has an emitter electrode 21 connected to ground potential. The transistor 17 is further provided with a collector electrode 22 which is connected to the negative terminal of a low capacitance power supply 23, the connection of the collector to the negative terminal being required since the transistor 17 is a PNP type. The positive terminal of the power supply 23 is shunted by series connected resistors 26 and 27 having a common junction 28 connected via a lead 29 to a base electrode 31 of a PNP transistor 32. The transistor 32 has an emitter electrode 33 connected to ground and a collector electrode 34 connected to the negative terminal of a second isolated power supply 36. The positive terminal of the isolated power supply 36 is connected to ground through a load resistor 37 and is shunted by series connected resistors 38 and 39 having a common junction point 41 connected via a lead 42 to the base 18 of the transistor 17. A second input terminal 42 of the circuit is connected to the base 31 of the transistor 32. Since PNP transistors are utilized, negative pulses must be applied to the input terminals 19 and 43 to increase conduction of the transistors and positive pulses could be utilized for terminating conduction through one of the transistors. Obviously, NPN transistors may be utilized, in which case the polarity of the power supplies 23 and 36 would be reversed and the polarity of the input pulses required to produce conduction and non-conduction in a particular transistor would be reversed from the case illustrated in FIGURE 2.

The basic difference between the circuits of FIGURES 1 and 2 is in the utilization of the voltage dividers 26, 27 and 38—39 which permit the D.C. level of the output signals to be selected at will. The ability to select the D.C. level by means of utilizing voltage dividers arises from the fact that substantially no signal degradation occurs across the isolated power supplies 23 and 36 and therefore so far as pulsating D.C. or A.C. voltages are concerned the positive and negative terminals of these supplies carry the same voltages. Consequently, the voltage dividers have little effect on the signal voltages of the circuit but merely change their D.C. level with respect to ground. The function of these resistors will become apparent upon a description of the operation of the circuit. Assuming initially that the transistor 17 is conductive and the transistor 32 is non-conductive, the positive terminal of the isolated power supply 23 is positive with respect to ground and therefore a positive voltage is applied to the base electrode 31 of the transistor 32 and the transistor is cut off. The fact that the transistor 32 is non-conductive renders the positive terminal of the power supply 36 at substantially ground potential and therefore the base electrode 18 of the transistor 17 is connected to a point of negative potential and the transistor 17 is highly conductive.

The positive voltage, with respect to ground, at the positive terminal of power supply 23; that is, at the upper end of the resistor 24, is a function of the characteristics of the transistor 17 and the value of the resistor 24. The value of this voltage is invariable and may be too high to permit direct application to the base electrode 31 of the transistor 32. The voltage divider comprising resistors 26 and 27 reduces the value of the D.C. voltage applied to the base 31 in accordance with the relative values of the resistors 26 and 27 and therefore permits ready selection of the maximum positive voltage with respect to ground that is applied to the base 31 of the transistor 32. Likewise, when the transistor 32 is conducting and the transistor 17 is non-conducting the relative values of the resistors 38 and 39 determine the positive voltage applied to the base 18 of the transistor 17. Either or both of the resistors of each of the voltage dividers may be made variable so that the values of these voltages may be varied at the will of an operator. The output voltage may be taken at the junctions of the resistors in the voltage dividers or alternatively may be taken at any point along the resistors so that a wide choice of D.C. levels is available at the output terminals of the circuit.

Figure 3:
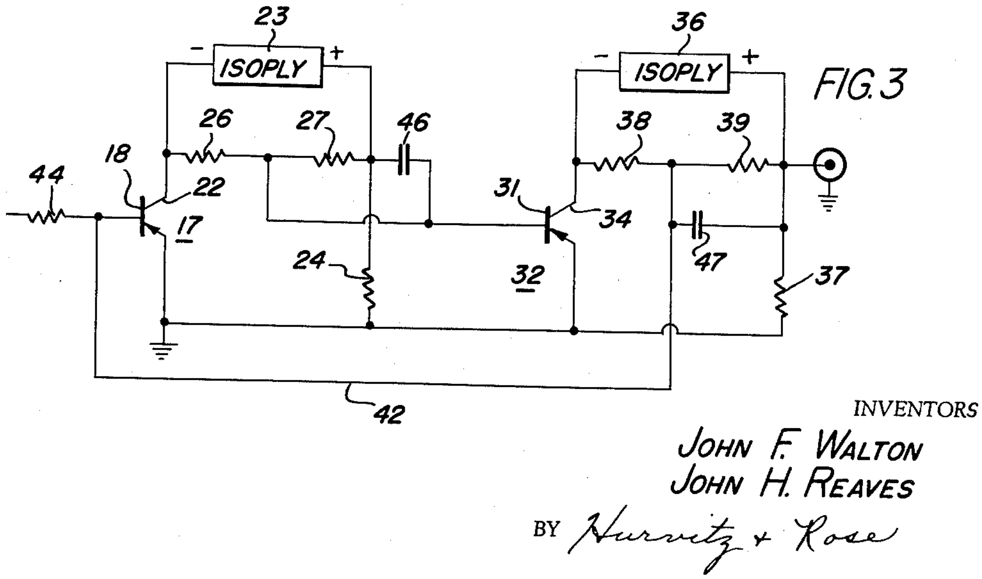
FIGURE 3 is a schematic wiring diagram of a modification of the circuit of FIGURE 2.

The circuits of FIGURES 1 and 2 are primarily flip-flop circuits requiring pulses to be applied to the two input terminals. In FIGURE 3 of the accompanying drawings, there is illustrated a circuit specifically adapted to receive positive and negative signal voltages and more particularly, the circuit is utilized as a rectangular wave generator driven from a sine wave source. These elements which are common to FIGURES 2 and 3 carry the same reference numerals and it can be seen that the only difference between the circuits resides in the utilization of an input resistor 44 connected to the base 18 of the transistor 17 and via a lead 42 to the junction of resistors 38 and 39. In addition to the resistor 44, the circuit of FIGURE 3 is provided with a capacitor 46 connected between the positive terminal of the supply 23 and the base 31 of the transistor 32 and a capacitor 47 connected between the positive terminal of the supply 36 and the base 18 of the transistor 17 via the lead 42. The capacitors 46 and 47 are utilized to increase the speed of response of the circuit. More specifically, these capacitors are employed in transistor circuits to overcome the effects of charge storage in the base region of the transistors and in both transistor and vacuum tube circuits are employed to compensate for the effects of the shunt capacity to ground of the input-electrode of the amplifying device.

In operation, upon the application of a sufficiently large positive pulse to the resistor 44 the base of the transistor 18 is driven positive, and conduction through the transistor 18 is reduced. Reduction in conduction through the transistor 18 reduces the voltage with respect to ground at the positive terminal of the supply 23 and permits a small amount of current to flow through the transistor 32. Conduction through the transistor 32 raises the voltage with respect to ground at the positive terminal of supply 36 and this increase in voltage is applied to the base 18 of the transistor 17 to further decrease its conduction. Therefore, the circuit rapidly switches states of conduction with the transistor 17 becoming non-conductive and the transistor 32 becoming conductive. When the transistor 32 begins to become conductive the capacitor 46 discharges to the extent necessary to supply the initial charges required in the base region of the transistor 32 and therefore hastens its response and increases the rate of operation of the entire circuit. Upon the application of a sufficiently large negative pulse to the resistor 44, the base 18, which was previously positive with respect to the emitter, is driven negative with respect thereto and initiates conduction through the transistor 17. Conduction through the transistor 17 raises the voltage at the base 31 of the transistor 32 and further reduces the voltage at the base 18 of the transistor 17. Thus, the action is cumulative and the circuit rapidly flips to its other stable condition. The capacitor 47 serves the same purpose as the capacitor 46 of supplying the initial charge which is stored in the input of the transistor 17 and therefore reduces the time constant of the circuit.

The output signal from the circuit of FIGURE 3, which may be taken at the junction of the resistors 37 and 39, 38 and 39 or at the collector electrode 34 of the transistor 32, is a clean rectangular wave form with sharp transitions. Rise times of 0.7 micro-seconds and fall times of 1.5 micro-seconds have been attained. The top and bottom of the wave form are flat regardless of the input wave. The circuit of FIGURE 3 may be driven by a sine wave voltage and thus may be employed as a sine-wave to square wave converter.

Figure 4:
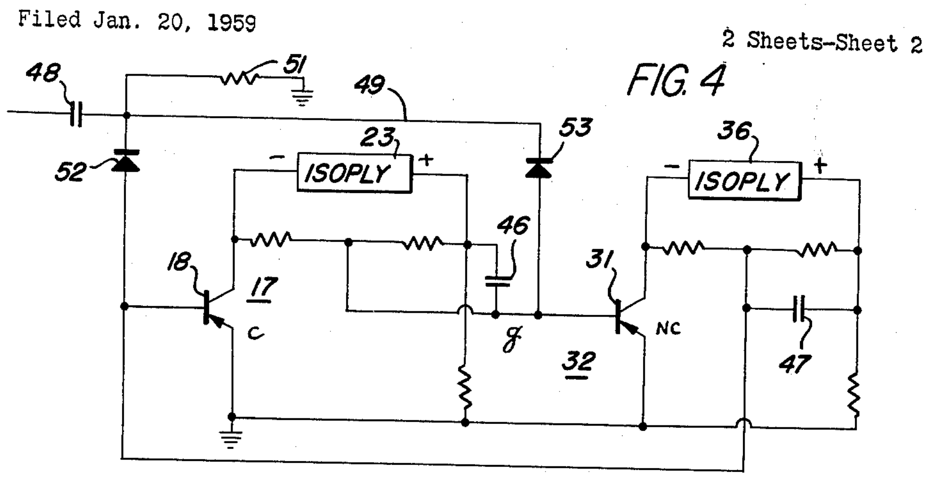
FIGURE 4 is a schematic wiring diagram of a binary scale embodying the circuit of FIGURE 3.

The circuits thus far described have been responsive to either positive pulses applied to two distinct input circuits of the apparatus as in FIGURES 1 and 2 or to alternate positive and negative pulses applied to a single input of the apparatus. In FIGURE 4 of the accompanying drawings, there is illustrated a bi-stable circuit which may be employed as a scale-of-two counting circuit. In order to achieve such operation the circuit must alternately flip from one state to another in response to pulses of the same polarity applied to a common lead. Those elements which are common to FIGURES 2, 3, and 4 bear the same reference numerals. In this circuit, which is particularly adapted to switch from one state to another on successive negative pulses, the pulses are applied through a coupling capacitor 48 to an input lead 49 connected to ground through a resistor 51. The input lead 49 is coupled through a diode 52 to the base 18 of the transistor 17 with the cathode of the diode 52 being connected to the lead 49. Further, the lead 49 is coupled through a diode 53 to the base electrode 31 of the transistor 32 with the cathode of the diode 53 being connected to the lead 49. In this circuit the capacitors 46 and 47 serve a dual function, the first being the same function as in the apparatus of FIGURE 3 and the second function being that of insuring proper commutation of the circuit between the two stable states in the response to repetitive negative input pulses.

The operation of the capacitors 46 and 47 in the circuit of FIGURE 4 can best be explained by referring momentarily to FIGURES 2 and 3. In FIGURE 2 the pulse voltage applied to the input terminals 19 and 43 is maintained at these terminals for a period which is at least as great as the interval required for the circuit to flip from one state to another. It is only after the circuit has switched that the pulse energy can be removed without fear of the circuit returning to its original state. The input pulse cannot be removed before the element that was non-conducting is now more conducting than the element that was initially conducting since otherwise the circuit would return to its initial condition. The circuit has no electrical inertia, not having any reactive elements therein so that, the element which is the more conductive when the input pulse is removed, regardless of which element was originally conducting, remains conductive and the other element becomes non-conductive. If a sine wave input is applied to the circuit of FIGURE 3 there is a continuous transition of voltage at the input terminals from one polarity to the other and therefore the circuit is driven completely from one state to the other by the input voltage. However, in the circuit of FIGURE 4 where pulse energy is applied to both input circuits if the capacitors 46 and 47 were not employed, the application of a pulse may either not cause a circuit to flip, if the pulse is too short, or if the pulse is too long may cause the circuit to switch to one condition and then switch back to its original condition. The capacitors on the other hand provide the necessary sustaining voltage to insure switching from one state to the other.

Proceeding to the description of operation of the circuit of FIGURE 4, the diodes 52 and 53 are back biased by the voltages on the bases of the transistors 17 and 32. If the transistor 17 is conducting and the transistor 32 is non-conducting, the voltage on the base electrode 18 of the transistor 17 is negative, with respect to ground. A negative voltage is applied to the anode of the diode 52 and therefore the negative voltage pulses applied to the junction of capacitor 48 and resistor 51 cannot pass through the diode. On the other hand, the voltage at the anode of the diode 53 is positive with respect to ground and the negative pulse applied to the circuit passes through this diode and is applied to the base 31 of the transistor 32. The capacitors 46 and 47 are employed to sustain the voltage applied to the base 31 and thereby prevent the circuit from returning immediately to the original state.

Returning to the situation where the transistor 17 is conductive, the pulse energy proceeds through the diode 53 and to the base electrode 51 of the transistor 32. The energy in the pulse is also stored in the capacitor 46 and maintains the voltage on the base electrode 31 of the transistor 32 again to insure a complete switching function.

The rise times of the pulses generated by the circuits of FIGURES 1 through 4 are limited by several factors and a principal one of these is the shunt capacity to ground of the isolated power supplies. More specifically, the shunt capacity to ground of the power supplies appears as a capacitive reactance in parallel with the load resistors of the circuits and the circuit has a time constant depending upon the values of the load resistors and the shunt capacity to ground of the supplies. The time constant of this circuit determines the interval required to charge this capacity and therefore to effect a change in the voltage level at the control electrodes of the amplifying elements in response to an applied signal. In accordance with a further embodiment of the invention the delay resulting from the shunt capacity to ground of the individual power supplies is substantially reduced to permit operation of the circuits at two to four times the speed of the circuits illustrated in FIGURES 1 through 4.

Figure 5:
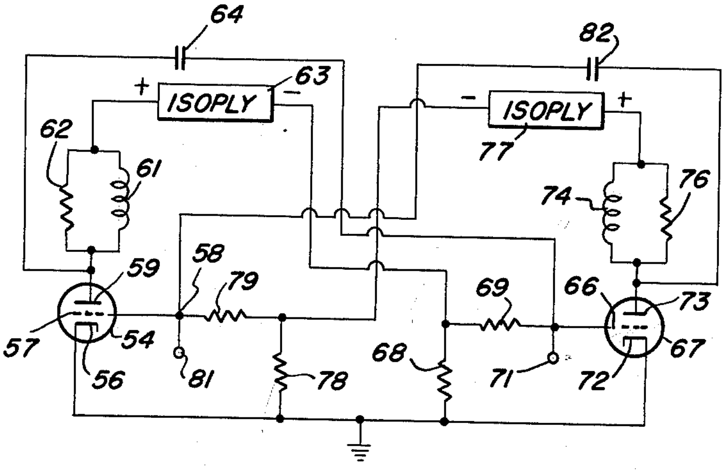
FIGURE 5 is a schematic wiring diagram of a modification of the circuit of FIGURE 1 employing high frequency compensating circuits.

Referring now specifically to the schematic circuit diagram of FIGURE 5, a triode 54 has a cathode 56 connected to ground, a control grid 57 connected to a junction point 58, and an anode 59 coupled through a parallel circuit comprising an inductance 61 and a resistor 62 to the positive terminal of a power supply 63. The anode 58 of the triode 54 is also coupled through a capacitor 64 to a control grid 66 of a second triode 67. The negative terminal of the power supply 63 is coupled through a load resistor 68 to ground and is also coupled through a resistor 69 to the control grid 66 of the tube 67. The control grid 66 is also coupled to a first output terminal 71 of the circuit. The tube 67 further comprises a cathode 72 connected to ground and an anode 73 connected through a parallel combination comprising an inductance 74 and a resistance 76 to the positive terminal of a second power supply 77. The negative terminal of the power supply 77 is connected through a load resistor 78 to ground and through a further resistor 79 to the junction 58. The junction 58 is connected to a second output terminal 81 and through a coupling capacitor 82 to the anode 73 of the tube 67.

Disregarding for the moment the effects of the inductors 61 and 76, resistors 62 and 74, capacitors 64 and 82, and resistors 69 and 70, the operation of the circuit is substantially identical with the operation of the circuit illustrated in FIGURE 1 of the accompanying drawings. As previously indicated, the frequency response of the circuit is effected by the shunt capacity of the ground of the supplies 63 and 77 and the circuit including the inductors, associated load resistors and capacitors compensate for these effects. More specifically, at the low frequencies the inductors 61 and 74 appear as very low impedances so that substantially none of the signal is attenuated in passing through these portions of the circuit. Substantially all of the signals appear across the resistors 68 and 78 and are coupled to the grids 57 and 66 through the resistors 69 and 79. However, as the frequency increases and the shunt capacity of the supplies 63 and 77 begin to reduce the effective impedance of the resistors 68 and 78. Consequently, the higher frequency portions of the signal; that is, those portions which are necessary to produce output signals having rapid rise times are developed across the inductors 61 and 74 and are coupled to the grids 66 and 57 respectively via the capacitors 64 and 82. More particularly, the shunt connected inductors and resistances comprise a high pass filter, while the load resistors, such as resistors 68 and 78 and the shunt capacity of ground of the supplies 63 and 77 form a low pass filter. The time constants of the two filters are made approximately equal so that their actions are complementary and the gain of the stage is uniform over a desired frequency spectrum. In order to assure that the capacitors 64 and 82 do not interfere with the operation of the circuit but serve the function of coupling capacitors only, the time constant of the capacitor 64 and resistor 69 and capacitor 82 and resistor 79 is made many times the time constant of the circuits comprising the parallel connected resistors and inductors.

Reviewing the operation of the circuit, the low frequency portion of the signals are developed primarily across the resistors 68 and 78 while the high frequency portions of the signals are developed across the inductors 61 and resistor 62 and inductor 74 and resistor 76 and the two signals are added in the resistors 69 on the one hand and 79 on the other so that signals which are substantially uniform over an entire frequency spectrum may be developed. In alternative embodiments of the invention (as illustrated in FIGURE 5) compensation may be effected by eliminating the inductors 61 and 74 and utilizing the capacitors 64 and 82 as frequency compensation circuits. In such a circuit the capacitors appear as high impedance at low frequencies and low impedances at high frequencies, and therefore the low frequency signals are coupled to the grids of the tube through the resistors 69 and 79 and the high frequency portions of the signals are applied through the coupling capacitors 64 and 82 to the grids of the tubes. Since the shunt capacity of the supplies 64 and 77 do not appear across the load resistors 62 and 76, no degradation of the high frequency signal occurs across these resistors and therefore the high frequency components of the signals appearing at the anodes 59 and 73 are unaffected thereby.

Other forms of high frequency compensation as taught in co-pending application Serial No. 777,037 filed on November 28, 1958, by John H. Reaves and John F. Walton may be utilized in the flip-flop circuit illustrated in FIGURE 5. Also the compensation circuits may be applied to transistorized versions of the flip-flop circuits and to binary scalers, or multi-vibrator circuits as indicated above.

The circuit illustrated in FIGURE 5 of the accompanying drawings utilizes triodes but may also employ pentodes. The circuit is particularly adapted to the use of pentodes since the screen grid voltage may be derived from the power supplies.

Figure 6:
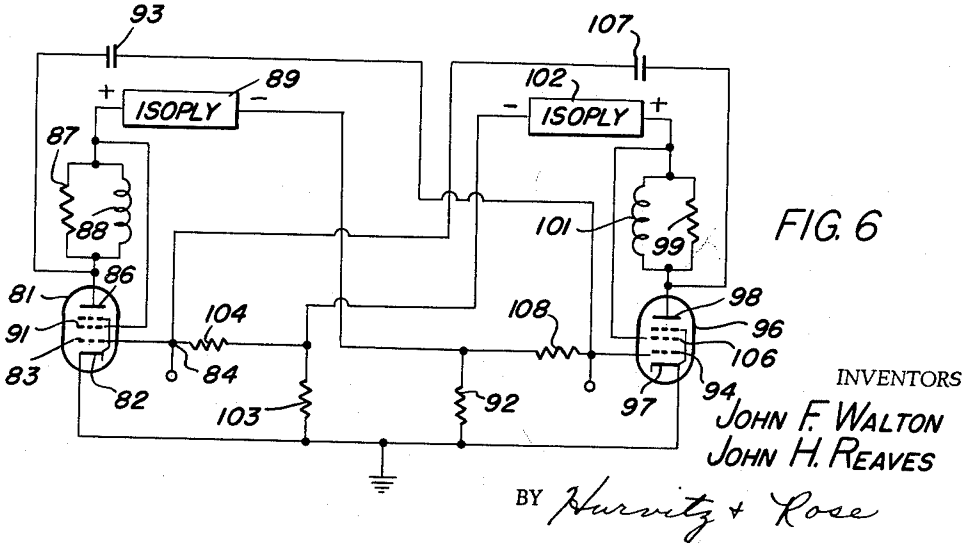
FIGURE 6 is a schematic wiring diagram illustrating a modification of the circuit of FIGURE 5.

Referring now specifically to FIGURE 6 of the accompanying drawings, a pentode 81 has a grounded cathode 82, a control grid 83 connected to a junction point 84, and an anode 86 connected through a parallel combination of a resistor 87 and an inductor 88 to a positive terminal of a power supply 89. The positive terminal of the supply 89 is also connected directly to a screen grid 91 of the pentode 81 to supply the grid voltage thereto. The negative terminal of the supply 89 is connected through a load resistor 92 to ground while the anode 86 is coupled through a coupling capacitor 93 to a control grid 94 of a second pentode 96. The pentode 96 also includes a grounded cathode 97, an anode 98 connected through a parallel combination of the resistor 99 and an inductor 101 to the positive terminal of a power supply 102. The negative terminal of the power supply 102 is connected through a load resistor 103 to ground and through another resistor 104 to the junction 84. A screen grid 106 of the pentode 96 is connected to the positive terminal of the supply 102. The anode 98 of the pentode 96 is also connected through a capacitor 107 to the junction 84 and the negative terminal of supply 89 is connected through a resistor 108 to the control grid 94 of the pentode 96.

It will be noted that the circuit of FIGURE 6 is substantially identical with the circuit of FIGURE 5 except for the fact that the pentodes are employed as amplifying elements and the screen grid voltages are derived from the positive terminals of the supplies 88 and 102. As a result, additional power supplies or complex isolation and divider circuits are not required in order to supply the screen grid voltage. The circuits of FIGURES 5 and 6 are illustrated as connecting the upper end of the load resistor through a summing resistor to the control grids of the tubes. It is not intended to limit the circuit to such an arrangement since a voltage divider may be placed across the supplies, as in FIGURES 2, 3, and 4 and the grid voltages taken from the dividers.

What we claim is:

1. A bi-stable circuit comprising a pair of amplifying elements each having a common electrode, a control electrode and a further electrode, a pair of load impedances, means for connecting each load impedance in series circuit with a common electrode and a further electrode of a different one of said amplifying elements, means for connecting a distinct power supply between each further electrode and its associated load impedance, a pair of impedance means, means for connecting each impedance means across a different one of said power supplies, coupling means for coupling signal voltages developed across said load impedances associated with said pair of amplifying elements each to said control electrode associated with the other of said pair of amplifying elements, said coupling means including an electrical connection between each control electrode and a predetermined point on the impedance means associated with the other of said amplifying elements, a pair of input circuits each including said control electrode and said common electrode of a different amplifying element and a pair of output circuits each including said further electrode and said common electrode of a different amplifying element.

2. The combination according to claim 1 wherein said amplifying elements comprise vacuum tubes and wherein said control electrodes are control grids and said further electrodes are anodes.

3. The combination according to claim 1 wherein said amplifying elements comprise transistors and wherein said further electrodes are collector electrodes and said control electrodes are base electrodes.

4. The combination according to claim 1 further comprising a pair of capacitors, and means connecting each capacitor between a different one of said control electrodes and a different one of said impedance means.

5. The combination according to claim 4 further comprising a pair of diodes and a lead and means connecting each of said diodes between said lead and a different one of said control electrodes.

6. A bistable circuit comprising a pair of amplifying elements each having a first electrode, a control electrode and a common electrode, a first pair of impedances, means connecting said common and said first electrodes of one of said amplifying elements in series with said first pair of impedances, means connecting a power supply between said impedances of said first pair of impedances, first coupling means for coupling information signals developed across said first pair of impedances and a bias voltage developed across one of said first pair of impedances to said control electrode of said other amplifying element, a second pair of impedances, means connecting said common electrode and said first electrode in series with said second pair of impedances, means connecting another power supply between said impedances of said second pair of impedances, and second coupling means for coupling information signals developed across said second pair of impedances and a bias voltage developed across one of said second pair of impedances to said control electrode of said one amplifying device, a pair of input circuits each including said control electrode and said common electrode of a different amplifying element and a pair of output circuits each including said further electrode and said common electrode of a different amplifying element.

7. The combination according to claim 6 wherein said coupling means comprise capacitors.

8. The combination according to claim 6 wherein the impedances connected between said first electrodes and the power supplies are resistors and further comprising two inductors, each of said inductors being connected in parallel with a different one of said last-mentioned resistors.

9. The combination according to claim 7 wherein said coupling means further comprises means for directly connecting said control electrode of said other amplifying device to the junction of the impedance of said first pair of impedances connected between said common electrode of said one amplifying device and its associated power supply, and means for directly connecting said control electrode of said one amplifying device to the junction of the impedance, of said second pair of impedances, connected between said common electrode of said other amplifying device and its associated power supply.

10. A bi-stable circuit comprising a pair of amplifying elements, each having a common electrode, a control electrode and a further electrode, a pair of load impedances, means for connecting a distinct power supply between each further electrode and a different load impedance, means for connecting the end of each of said load impedances remote from its associated supply to a reference potential, a pair of impedance means, means connecting each impedance means across each of the power supplies, and coupling means for coupling signal and bias voltages developed across said load impedances associated with said pair of amplifying elements each to said control electrode associated with the other of said pair of amplifying elements, said coupling means including means interconnecting each control electrode and a predetermined point on the impedance means associated with the other amplifying element a pair of input circuits each including said control electrode and said common electrode of a different amplifying element and a pair of output circuits each including said further electrode and said common electrode of a different amplifying element.

11. The combination according to claim 10 further comprising means connected at least in part between each of said further electrodes and their associated power supplies for compensating for degradation of high frequency signals.

12. The combination according to claim 6 wherein one of said impedance means of each of said pairs is a low pass filter and the other of said impedances of each of said pairs is a high pass filter, said low pass filter being disposed between said first electrode and the power supply.

13. The combination according to claim 12 wherein each of said high pass filters comprises a resistor and the shunt capacity to ground of a different one of said power supplies.

14. The combination according to claim 12 wherein said high pass filter comprises a resistive and a reactive element connected in parallel.

References Cited in the file of this patent

UNITED STATES PATENTS

| | | |
|---|---|---|
| 2,890,418 | Zawels | June 9, 1959 |
| 2,902,674 | Billings et al. | Sept. 1, 1959 |